United States Patent [19]

Silber et al.

[11] 4,122,480

[45] Oct. 24, 1978

[54] LIGHT FIRED THYRISTOR WITH FAULTY FIRING PROTECTION

[75] Inventors: Dieter Silber, Hausen; Karl-Julius Finck, Frankfurt; Marius Füllmann, Neu-Isenburg; Wolfgang Winter, Eschborn, all of Fed. Rep. of Germany

[73] Assignee: Licentia Patent-Verwaltungs-G.m.b.H., Frankfurt am Main, Fed. Rep. of Germany

[21] Appl. No.: 738,363

[22] Filed: Nov. 3, 1976

[30] Foreign Application Priority Data

Nov. 5, 1975 [DE] Fed. Rep. of Germany ....... 2549563
Nov. 5, 1975 [DE] Fed. Rep. of Germany ....... 7535173

[51] Int. Cl.$^2$ .................................. H01L 29/74
[52] U.S. Cl. ........................... 357/38; 357/30; 357/55; 357/86
[58] Field of Search .................. 357/30, 38, 55, 86

[56] References Cited

U.S. PATENT DOCUMENTS

| | | | |
|---|---|---|---|
| 3,622,845 | 11/1971 | McIntyre et al. | 357/38 |
| 3,697,833 | 10/1972 | Nakata | 357/30 |
| 3,719,863 | 3/1973 | Ogawa et al. | 357/38 |
| 3,794,890 | 2/1974 | Weimann | 357/38 |
| 3,818,370 | 6/1974 | Abe et al. | 357/38 |
| 3,893,153 | 7/1975 | Page et al. | 357/38 |
| 4,012,761 | 3/1977 | Ferro et al. | 357/38 |

FOREIGN PATENT DOCUMENTS

| | | | |
|---|---|---|---|
| 2,511,281 | 9/1975 | Fed. Rep. of Germany | 357/38 |
| 47-22,429 | 6/1972 | Japan | 357/38 |
| 1,240,510 | 7/1971 | United Kingdom | 357/38 |

*Primary Examiner*—Joseph E. Clawson, Jr.
*Attorney, Agent, or Firm*—Spencer & Kaye

[57] ABSTRACT

A light fired thyristor including a semiconductor body having four zones of alternatingly opposite conductivity types constituting a first or cathode emitter zone, a control base zone adjacent thereto, a main base zone and a second or anode emitter zone with the cathode emitter zone being formed within the control base zone at one major surface of the semiconductor body and being divided into a plurality of separate regions of which one serves as the firing region of the first emitter zone to fire the thyristor in response to impinging radiation energy. The firing region of the first emitter zone is provided in part with a first ohmic contact which is ohmically connected to a further ohmic contact connected to the control base region adjacent the edge of the semiconductor body. The remaining regions of the first emitter zone are provided with a cathode contact which simultaneously contacts the portions of the control base zone between these regions and forms short circuits with the control base zone. Consequently with interfering currents which are approximately uniformly distributed over the thyristor area, an increase in potential is produced in the firing region of the first emitter zone which increase is in the same direction as the increase in potential in the firing region of the control base zone and the likelihood of a faulty firing of the thyristor is reduced.

9 Claims, 2 Drawing Figures

LIGHT FIRED THYRISTOR WITH FAULTY FIRING PROTECTION

BACKGROUND OF THE INVENTION

The present invention relates to a light fired thyristor including a semiconductor body with four zones of alternating conductivity type including a first emitter zone, a control base zone adjacent thereto, a further base zone (main base zone) and a second emitter zone.

When firing of a thyristor is effected by light energy, pairs of charge carriers must be generated in the base zones of the thyristor instead of charge carriers being injected by means of a control contact, and some of the minority charge carriers will then pass through the center pn-junction, which is charged in the reverse direction, and produce a photocurrent. This photocurrent again effects increased injection of the cathode-side emitter and thus a feedback connection for the firing process. Due to the current dependency of the current gain factors in the two partial transistors of the thyristor, a sufficiently high light excitation meets the firing condition that the sum of the current gain factors becomes equal to 1. The light energy is generally introduced through the emitter zone adjacent the control base zone since in this way it is possible to realize localized excitation at high excitation density.

For light fired thyristors sufficient protection must be provided against firing processes or interfering currents, respectively, which are produced as a result of an increase in the forward blocking current due to an increase in temperature or as a result of too high a rate of voltage rise (dv/dt) in the forward direction. These currents are distributed approximately uniformly over the thyristor area in perfect devices and will hereinafter be called interfering currents. This problem is encountered particularly in the firing region of the thyristor. If this region is designed to be sensitive to firing at a low excitation density by suitable geometric dimensions and doping, undesired firing will occur already at low values of interfering currents.

SUMMARY OF THE INVENTION

It is therefore the object of the present invention to make a light fired thyristor sensitive to light irradiation particularly in the firing region and at the same time take care that faulty firing as a result of capacitive currents at too high a rate of voltage rise or as a result of increased forward blocking currents is prevented in the firing region.

This is accomplished according to the invention in that in a semiconductor body having four zones of alternatingly opposite conductivity type including a first or cathode emitter zone, a control base zone adjacent thereto, a main base zone and a second emitter zone, and having the first emitter zone formed within the control base zone at one major surface of the semiconductor body; the first emitter zone is divided into a plurality of separate regions of which one region serves as the firing region of the first emitter zone to fire the thyristor by means of impinging radiation energy, a first contact is provided on the major surface for partially contacting the firing region of the first emitter zone, a second contact is provided on the major surface of the control base zone at the edge of the semiconductor wafer which second contact is ohmically connected with the first contact, and the remaining regions of the first emitter zone are provided with a cathode contact which simultaneously contacts the portions of the control base zone extending to the major surface between the emitter zone regions to form short circuits with the control base zone, so that with interfering currents which are distributed approximately uniformly over the thyristor area, an increase in potential is produced in the firing region of the first emitter zone which increase is in the same direction as the increase in potential of the control base zone in the firing region of the thyristor.

The operation of the thyristor according to the invention is based on the fact that the interfering currents are distributed evenly over the thyristor area and, in particular, also flow in the region of the semiconductor body adjacent the edge of same.

In the preferred embodiment of the invention, when an interfering current is present, an increase in potential occurs at the second contact, i.e., the contact connected to the control base zone adjacent the edge of the semiconductor body, which increase is about 50 to 100% of the maximum increase in potential in the firing region of the control base zone. In order to produce such an increase in potential at the second contact, and thus in the firing region of the first or cathode emitter zone, the transverse conductance of the control base zone between the second contact and the adjacent edge of the cathode contact is designed accordingly. The effect according to the invention occurs in any case whenever under the maximum possible dv/dt load of the thyristor, the potential in the firing region of the first emitter zone is raised by at least 0.1 to 0.2 volt.

The interference stability of the entire thyristor can be increased if the cathode contact extends beyond the outermost of the remaining regions of the first emitter zone to contact the control base zone. Moreover, in order to increase the firing sensitivity of the thyristor the firing region of the first emitter zone is selected to be thinner than the remaining regions of the first emitter zone.

DETAILED DESCRIPTION OF THE PREFERRED EMBODIMENT

Figure 1:
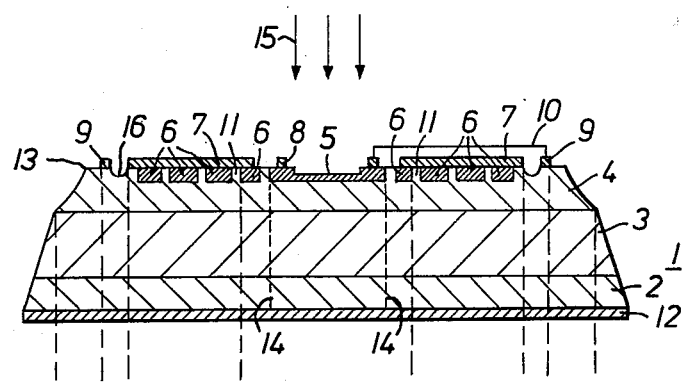
FIG. 1 is a schematic sectional view of a preferred embodiment of a light fired thyristor according to the invention.

Referring now to FIG. 1 there is shown a thyristor according to the invention including a semiconductor body 1 having four zones of alternatingly opposite conductivity type with three of the zones, which are arranged for example in a pnp sequence being substantially parallel to the major surfaces of the semiconductor wafer and constituting an emitter zone 2, a main base zone 3 and a control base zone 4. The fourth or cathode emitter zone of the thyristor, which is of $n^+$ conductivity type in the illustrated embodiment, is formed within the control base zone 4 at one major surface 13 of the semiconductor body and is divided into a plurality of spaced regions 5 and 6 so that, as shown, the control base zone 4 extends to the major surface 13 between the regions 5 and 6 and adjacent the edge of the semiconductor body 1. Preferably, in order to increase the firing sensitivity of the thyristor, the region 5 is formed so that it is thinner, than the regions 6.

The central region 5 of the cathode emitter zone serves to fire the thyristor. The region of the thyristor which lies within the dashed lines 14 in the drawing will hereinafter be called the firing region of the thyristor and can also be considered as an auxiliary thyristor to fire the remaining main thyristor. The other or remaining emitter regions 6 serve to conduct the load current and are provided with an ohmic cathode contact 7. The anode emitter zone 2 is provided with an ohmic anode contact 12 which as shown is disposed on the opposite major surface of the semiconductor body 1. In the illustrated embodiment the firing region 5 of the cathode emitter zone is circular and substantially centrally located on the major surface 13 and the emitter regions 6 are annular regions which concentrically surround the region 5. The cathode contact 7, which is likewise annular, covers the regions 6 and simultaneously contacts the portions of the control base zone 4 extending therebetween to form short circuits between emitter regions 6 and the control base zone 4. In this way it is known to substantially prevent the occurrence of faulty firings in the main thyristor portion of the thyristor structure. In order to increase the interference stability of the entire thyristor structure, as shown, the cathode contact 7 extends laterally beyond the outermost of the regions 6 and contacts the underlying portion of the control base zone 4 which extends to the major surface 13.

The emitter surface area of firing region 5 of the cathode emitter serves to receive the light irradiation which is indicated symbolically by arrows 15. In the illustrated embodiment, the firing region 5 of the cathode emitter zone is provided with an annular, metal contact 8. On the major surface 13 at the edge of the control base zone 4 there is a further ohmic annular contact 9 which is connected with contact 8 via an ohmic connection 10. In this way it is accomplished that, particularly when an interfering current is present, the potential of the control base zone 4 at the location of contact 9 is simultaneously also transmitted via connection 10 and contact 8 to the $n^+$-conductive firing region 5 of the cathode emitter zone.

Figure 2:
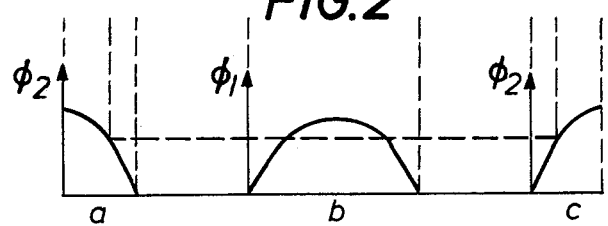
FIG. 2 shows the shape of the potential at various points in the thyristor of FIG. 1 when there is an interfering current.

The operation of the light fired thyristor according to the invention will be explained in connection with FIG. 2. In this figure the potentials at three points of the thyristor are shown as they develop when an interfering current flows. FIG. 2b shows the shape of potential $\phi_1$ in the portion of the control base zone 4 below firing region 5 of the cathode emitter zone. If the cathode potential is taken as reference potential, the potential across the control base zone increases from the innermost short-circuit point 11, reaches its maximum in the middle of the firing region (between dashed lines 14) and then drops toward the corresponding short-circuit point on the opposite side. FIGS. 2a and 2c show the potential curve $\phi_2$ as it develops in the present, exemplary thyristor embodiment from the edge of the cathode contact 7 to the edge of the thyristor. Contact 9 is now placed on the major surface 13 at the point on the potential curve where the potential is between 50 to 100% of the maximum potential of FIG. 2b. Since this potential is also present across region 5, it will be rasied by the same amount dashed curve in FIG. 2b compared to the uncharged case so that no injection from zone 5 takes place via the pn-junction formed between control base zone 4 and firing region 5 and thus no faulty firing takes place.

The increase in potential in the firing region 5 of the cathode emitter zone is determined at a given interfering current by the transverse conductance between contact 9 and the oppositely disposed edge of contact 7. It can be set, for example, by a reduction in the cross section of the control base zone 4 in this region and in this case produces the relatively steep rise of potential between the dashed lines. In the illustrated embodiment this reduction in the cross section of control base zone 4 is provided by means of an annular recess or groove 16 formed in the major surface 13 between the contacts 7 and 9.

A thyristor with the above described advantages is made in the following way: The basic pnp-structure is formed from a 30 mm diameter silicon slice with $4 \cdot 10^{13} \text{cm}^{-3}$ phosphorous doping, the thickness of which is c. 600 $\mu$m. The p-zones are formed with 60 h Ga-diffusion at 1250° C. The p-zone which will become trigger base 4 is reduced by lapping and etching to a sheet resistivity of c. 350 ohms per square. The $n^+$-emitter zones 5 and 6 are formed by standard oxide masked phosphorus diffusion to c. 7 $\mu$m thickness; the surface concentration is c. $10^{20} \text{cm}^{-3}$. The thickness of region 5 of the $n^+$-zone is reduced by selective masked etching to 2.5 $\mu$m. The emitter shorting holes in zone 6 have a hexagonal configuration, 400 $\mu$m diameter, c. 1 mm nearest distance. The central region 5 has 3.5 mm diameter, it is separated from zone 6 at a distance of c. 150 $\mu$m. The outer diameter of the cathode metallization 11 is 20 mm, the inner and outer diameters of the ring contact 9 are 22 mm and 24 mm respectively. The ohmic resistance between the metallizations 9 and 11 has to be adjusted by etching the groove 16 to achieve a sufficiently high value for compensation, it will finally be in the range between 5 and 10 ohms.

Such a device can be fired at a minimum light trigger power below 5 mW at 6 V and below 3 mW at 1000 V forward blocking voltage (at room temperature), when radiation of c. 930 nm wavelength is irradiated to a region of 1 mm diameter which is central in region 5. Its rate of voltage rise is above 2000 V/$\mu$s to 2000 V test voltage at 125° C. junction temperature.

It will be understood that the above description of the present invention is susceptible to various modifications, changes and adaptations, and the same are intended to be comprehended within the meaning and range of equivalents of the appended claims.

What is claimed is:

1. In a light fired thyristor including: a semiconductor body having four zones of alternatingly opposite conductivity types including a first emitter zone, a control base zone adjacent thereto, a main base zone adjacent said control base zone and a second emitter zone adjacent said main base zone, said first emitter zone being formed within said control base zone at one major surface of said semiconductor body and being divided into a plurality of laterally spaced separate regions, so that said control base zone extends to said one major surface between said regions of said emitter zone and adjacent the edges of said semiconductor body; an ohmic contact for said second emitter zone; a first ohmic contact on said one major surface and contacting only a portion of the surface of one of said regions of said first emitter zone, a further portion of said surface of said one of said regions of said first emitter zone being exposed to provide a radiation receiving surface so that said one region serves to fire the thyristor in response to impinging radiation energy; and a second ohmic cathode contact on said major surface ohmically contacting the remaining regions of said first emitter zone and the portions of said control base zone extending therebetween to said one major surface to form short circuits with said control base zone the improvement comprising: means for providing compensation for an increased potential in said control base zone below said one region of said first emitter zone caused by an interfering potential due to the dv/dt loading or the higher blocking current resulting from higher temperature, said means including a third ohmic contact on said major surface near the edge of said semiconductor body and contacting said control base zone and positioned so that a compensation potential of at least 50% of said interfering potential, and in the same direction, is produced at said third ohmic contact, and means for ohmically connecting said first and third ohmic contacts, whereby said compensation potential is applied to said one region of said first emitter zone so that its potential is raised to approximately the interfering potential of said control base one beneath said one region of said first emitter zone.

2. A thyristor as defined in claim 1 wherein: said one region of said first emitter zone is a circular region which is disposed substantially in the center of said one major surface; and said remaining regions of said first emitter zone include a plurality of annular regions which are concentrically disposed about said one region of said first emitter zone.

3. A thyristor as defined in claim 2 wherein said first, second and third contacts are annular contacts.

4. A thyristor as defined in claim 1 wherein the increase in potential in said one region of said first emitter zone is determined by the transverse conductance of the control base zone between said third contact and the adjacent edge of said cathode contact.

5. A thyristor as defined in claim 4 further comprising means for changing the normal transverse conductance of said control base zone between said third contact and the adjacent edge of said cathode contact.

6. A thyristor as defined in claim 5 wherein said means for changing the normal transverse conductance comprises a recess formed in said one major surface and situated between said third and said cathode contacts.

7. A thyristor as defined in claim 1 wherein said cathode contact extends laterally beyond the outermost of said remaining regions of said first emitter zone and contacts the adjacent portion of said control base zone.

8. A thyristor as defined in claim 1 wherein said one region of said first emitter zone is thinner than said remaining regions of said first emitter zone.

9. A thyristor as defined in claim 3 further comprising means for changing the normal transverse conductance of said control base zone between said third contact and the adjacent edge of said cathode contact including an annular recess formed in said one major surface between said third contact and said cathode contact and extending partially into said control base zone.

* * * * *